(12) United States Patent
Besling

(10) Patent No.: US 8,445,382 B2
(45) Date of Patent: May 21, 2013

(54) SIDE WALL PORE SEALING FOR LOW-K DIELECTRICS

(75) Inventor: Willem Frederik Adrianus Besling, Eindhoven (NL)

(73) Assignee: NXP B.V., Eindhoven (NL)

( * ) Notice: Subject to any disclaimer, the term of this patent is extended or adjusted under 35 U.S.C. 154(b) by 823 days.

(21) Appl. No.: 11/909,442

(22) PCT Filed: Mar. 20, 2006

(86) PCT No.: PCT/IB2006/050846
§ 371 (c)(1),
(2), (4) Date: Aug. 25, 2009

(87) PCT Pub. No.: WO2006/100632
PCT Pub. Date: Sep. 28, 2006

(65) Prior Publication Data
US 2009/0321945 A1    Dec. 31, 2009

(30) Foreign Application Priority Data
Mar. 22, 2005 (EP) ..................... 05300202

(51) Int. Cl.
*H01L 21/44* (2006.01)

(52) U.S. Cl.
USPC ........... 438/687; 257/632; 257/637; 257/642; 257/750; 257/753; 257/759; 257/760; 257/774; 257/E23.041; 257/E23.116; 257/E23.134; 257/E21.492; 257/E21.575; 257/E21.583; 438/622; 438/624; 438/627; 438/629; 438/634; 438/636; 438/672; 438/694; 438/717; 438/725; 438/736; 438/740; 438/780

(58) Field of Classification Search
USPC .............. 257/632–637, 642, 643, 750, 751, 257/753, 759, 760, 762, 767, 774, E23.041, 257/E23.116–E23.12, E23.134, E23.142, 257/E23.151, E23.154, E23.167, E23.175, E21.273, E21.492, E21.575, E21.579, E21.583; 438/622–624, 627–629, 634, 636, 672, 687, 438/694, 717, 725, 736, 740, 780
See application file for complete search history.

(56) References Cited

U.S. PATENT DOCUMENTS
6,528,409 B1    3/2003 Lopatin et al.
(Continued)

FOREIGN PATENT DOCUMENTS
CN    1502123 A    6/2004
EP    1403925 A2    3/2004

OTHER PUBLICATIONS

Hu; et al "Spin-On Barrier for Pore-Sealing on 2.2 Porous Ultra Low-k Material" Proceedings of the Advanced Metallization Conference AMC 2003, Oct. 21, 2003, pp. 421-427.

(Continued)

*Primary Examiner* — Meiya Li

(57) ABSTRACT

A dual damascene process for forming conductive interconnects on an integrated circuit die. The process includes providing a layer (16) of porous, ultra low-k (ULK) dielectric material in which a via opening (30) is subsequently formed. A thermally degradable polymeric ("porogen") material (42) is applied to the side wall sidewalls of the opening (30) such that the porogen material penetrates deeply into the porous ULK dielectric material (thereby sealing the pores and increasing the density thereof). Once a conductive material (36) has been provided with the opening (30) and polished back by means of chemical mechanical polishing (CMP), the complete structure is subjected to a curing step to cause the porogen material (44) with the ULK dielectric layer (16) to decompose and evaporate, thereby restoring the porosity (and low-k value) of the dielectric layer (16).

Attached are a marked-up copy of the originally filed specification and a clean substitute specification in accordance with 37 C.F.R. §§1.121(b)(3) and 1.125(c). Applicant respectfully submits that the substitute specification contains no new matter.

9 Claims, 4 Drawing Sheets

U.S. PATENT DOCUMENTS

| | | |
|---|---|---|
| 6,703,324 B2 | 3/2004 | Wong |
| 2004/0150075 A1 | 8/2004 | Kaji |
| 2004/0157436 A1* | 8/2004 | Wong ............................ 438/672 |
| 2005/0127515 A1* | 6/2005 | Knorr et al. .................... 257/762 |
| 2005/0151266 A1 | 7/2005 | Yoshizawa et al. |

OTHER PUBLICATIONS

International Search Report for PCT/IB2006/050846 dated Jun. 30, 2006.

* cited by examiner

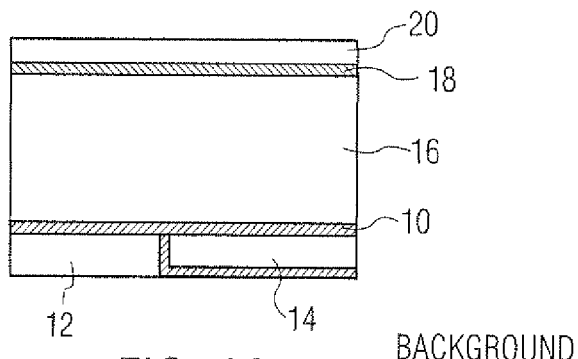
FIG. 1A BACKGROUND
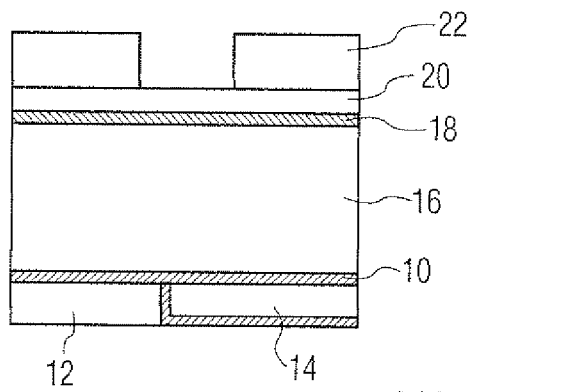
FIG. 1B BACKGROUND
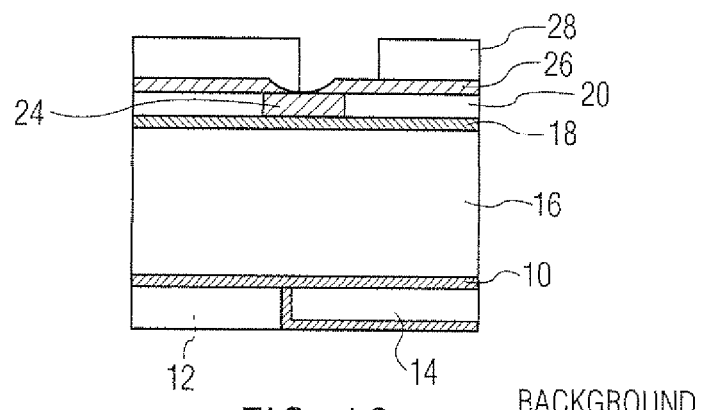
FIG. 1C BACKGROUND

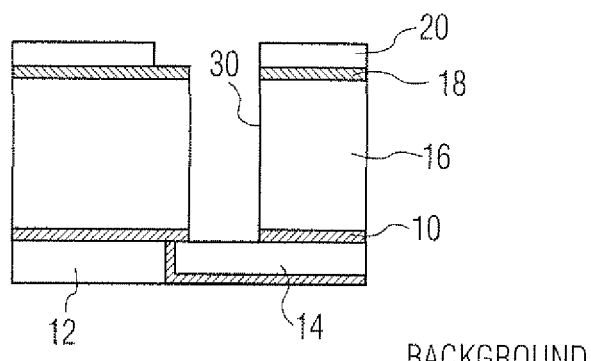
FIG. 1D BACKGROUND
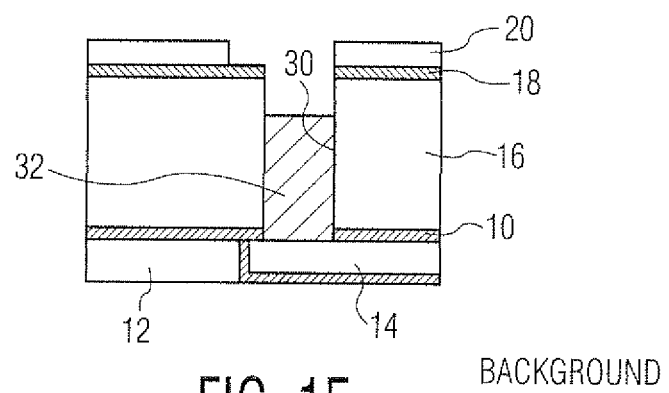
FIG. 1E BACKGROUND
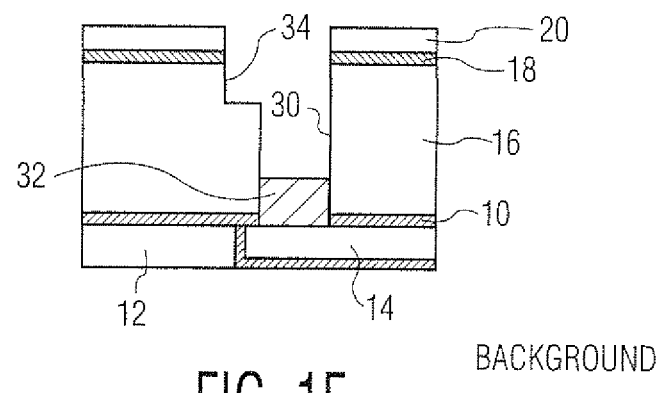
FIG. 1F BACKGROUND

SIDE WALL PORE SEALING FOR LOW-K DIELECTRICS

The invention relates generally to sidewall pore sealing for ultra low-k dielectrics so as to prevent degradation of an interconnect structure formed in porous low-k dielectric material.

BACKGROUND

A long-recognized important objective in the constant advancement of monolithic integrated circuit (IC) technology is the scaling down of IC dimensions. Such scaling down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions. However, as IC dimensions are scaled down, the distance between interconnect structures decreases, and it is necessary, therefore, to minimize the dielectric constant of the insulating layer in which the interconnects are formed, so as to maximize speed performance of the integrated circuit and minimize power dissipation and cross-talk between interconnect structures. For this reason, porous, ultra low-k (ULK) materials are now being routinely integrated in interconnect stacks.

One of the primary concerns of integrating porous ULK materials in interconnect stacks is the role of porosity during manufacturing and its effect on reliability performance. It is well known that the creation of pores in dielectric materials, to reduce dielectric constant, creates problems with the mechanical and electrical integrity of the structures during subsequent processing like barrier and metal deposition, chemical mechanical polishing (CMP), thermal cycling, and packaging. Penetration of material during processing should be avoided at all cost. To mitigate the negative effects of these pores, approaches are needed to seal the pores in the metal low-k interface. The modification of the porous low-k metal interface is commonly referred to as "pore sealing". Pore sealing is required to prevent:

diffusion of precursors from chemical vapor deposition (CVD) or atomic layer deposition (ALD) barriers into the ULK that lowers dielectric breakdown and increases leakage current, moisture uptake from ambient conditions after etch being adsorbed into the ULK, penetration of cleaning solutions used for striping etch residues and cleaning copper Cu via bottom, easy Cu penetration into the ULK during thermal stressing due to discontinuous barrier deposition on porous ULK sidewalls.

Numerous approaches have been proposed in literature to prevent diffusion of chemicals into the porous dielectric. These approaches can be classified into three major classes, as follows:

Firstly, very thin liners can be used to block the pores. These liners can either be deposited by plasma enhanced chemical vapor deposition (PECVD), e.g., PECVD SiC, spin-coating, e.g., benzocyclobutene (BCS) polymers, or by CVD, e.g., poly p xylilene. It has been shown that at least a 10 nm PECVD SiC liner is needed to seal pores, thereby negatively acting on the effective dielectric constant (k effective) and/or the Cu resistivity. If really thick liners are needed to seal the pores, a relative large fraction of the inter metal dielectric has a large k-value having a negative impact on the overall k-value. These polymeric films are partly penetrating into the pores leaving a uniform film behind. The disadvantage is that either selectivity is required or that the bottom of vias need to be opened by a plasma etch that could destroy/remove completely the deposited film. Normally, etch and strip recipes are optimized to remove completely polymeric residues to improve on via resistance, yield and interconnect reliability. Controlling a certain amount of polymers at via level is therefore difficult to achieve. Moreover, extra integration steps are making the whole integration rather expensive.

In literature, plasma surface treatments have been proposed extensively to modify and restructure the interface and, thereby, to perform pore sealing. The plasma is either based on remote reactive plasmas with $N_2$, $H_2$ and $O_2$ gases and mixtures thereof or based on reactive ion etching. Pore sealing has also been accomplished by using etch by-products. Other proposals have employed gas cluster ion beams (GCIB) to density and close the sidewall surface. GCIB is a technique where clusters of high-energy gas molecules impact on the surface, break apart, and transfer their momentum in lateral direction. The surface modification is based on a densification of the porous material at the sidewall in such a way that diffusion of reactants does not occur anymore. A certain need of inertia and chemical reactivity is needed to accomplish this restructuring. The danger is always that the line dimensions etched into the fragile dielectrics cannot be kept. Especially for materials that have a large porosity and a large pore diameter the amount of material that needs to be restructured/redeposited is not enough to close the surface. Moreover, upon using a plasma the risk is imminent that the dielectric permittivity of the ULK is altered.

In summary, the liner and the surface modification techniques both rely on deposition and/or redeposition of material thereby potentially modifying the dielectric constant of the low-k material.

A third relatively new method to prevent diffusion is to create the porous structure after barrier and Cu metal deposition. In spin-on dielectrics the porosity is normally created directly after low-k deposition in a cure step. In order to do so, a degradable molecule or polymer called "porogen" is added to the low-k spin-on formula and is decomposed/evaporated during a cure step thus leaving a porous structure behind. The clear advantage of this method, which is referred to in, for example, U.S. Pat. No. 6,528,409, is that via cleaning liquids cannot penetrate into the porous low-k during strip and that ALD precursors cannot diffuse into the dielectric during barrier deposition. The disadvantage is that the ULK film is not completely cured yet and that additional shrink could cause mechanical stress during integration. Another significant drawback is that the so-called solid first approach cannot be applied to PECVD SiOC deposited low-k materials. Nowadays, PECVD is the preferred deposition technique as opposed to spin-on approaches. Therefore, a pore sealing approach for ULK dielectrics deposited with PECVD is needed that avoids the problems associated with liners and surface treatments and uses that advantages of the solid first approach.

SUMMARY

It is therefore an object of the present invention to provide an improved process for sealing the porous sidewalls of the inter-layer dielectric (ILD) so as to prevent diffusion of reactants/solvents inside a porous ultra low-k dielectric, whereby no subsequent curing step is required to create a porous ILD.

Thus, in accordance with the present invention, there is provided a method of forming a conductive interconnect structure on an integrated circuit die, the method comprising providing a layer of porous, low-k dielectric material, removing a selected portion of said dielectric material to form a respective opening, applying a porogen material to said dielectric material so as to cause said porogen material to penetrate into said dielectric material, providing a conductive material in said opening to form said interconnect, and subsequently performing a curing step to remove said porogen material from said dielectric material so as to restore the porosity thereof.

In one embodiment, the porogen material is applied to the dielectric material before formation of the opening, i.e., after blanket porous ULK deposition. If the pore size is sufficiently large and the penetration depth is equal to the stack height, this is a relatively easy way to apply the porogen. A potential drawback of this approach is that for certain ULK materials a porosity gradient exists, whereby deposited films are relatively dense on the top and become more porous with increasing depth. In this case, it is preferred to apply the porogen material to the dielectric material after formation of the opening, preferably to a sidewall thereof.

Thus, by means of the process of the present invention, as defined above, diffusion of chemical reactants/solvents inside a porous ultra low-k dielectric is prevented by "stuffing" the porous structure with a thermally degradable polymer material ("porogen"), and then causing the degradable polymer to decompose and evaporate during a subsequent curing step performed after the complete integration process, so as to leave a porous (SiOC) matrix behind. In a first embodiment, porogen removal by means of the curing step can be performed after the complete integration process, in which case, all remaining dielectric material (e.g. SiC dielectric barriers) need to have a certain porosity to be able to remove all porogen, and it has been shown that this is possible with certain SiC-based dielectric barriers which may be needed to cap the metal lines. Future developments in respect of the interconnects envisage self-aligned barriers like CoWP, which will alleviate the above-mentioned "bake out" issue. In an alternative embodiment, the porogen can be removed by performing the curing or bake out step after each copper CMP step.

In one exemplary embodiment, in a dual damascene process, the opening is a via opening, and the porogen material is provided in the form of a resist layer in respect of a trench etch process. In an alternative exemplary embodiment, the porogen material is provided on the sidewalls of the via opening and a resist layer is provided therein subsequently in respect of a trench etch process. In a preferred exemplary embodiment, subsequent to the application of a porogen material to the sidewalls of the opening, a layer of barrier material is applied to said sidewalls, prior to the provision of the conductive material in said opening. The barrier material is preferably provided by means of an atomic layer deposition process. The conductive material is beneficially copper.

The present invention extends to a conductive interconnect formed by means of the above-defined method, and to an integrated circuit die comprising a plurality of such conductive interconnects thereon.

These and other aspects of the present invention will be apparent from, and elucidated with reference to, the embodiment described herein.

BRIEF DESCRIPTION OF THE DRAWINGS

An embodiment of the present invention will now be described by way of example only and with reference to the accompanying drawings, in which:

FIGS. 1a to 1h illustrate schematically an interconnect fabrication process according to the prior art; and FIGS. 2a to 2i illustrate schematically an interconnect fabrication process according to an exemplary embodiment of the present invention.

DETAILED DESCRIPTION

As known to a person skilled in the art, a fabrication process known as "Dual Damascene" is commonly used to create the multi-level, high density metal interconnections required for advanced, high-performance integrated circuits, and while the above-mentioned ultra low-k dielectrics reduce the parasitic capacitance between the lines, the use of copper as the interconnect metal reduces the resistance of the interconnect lines (and increases their reliability), relative to aluminum. Because copper does not form a volatile by-product, it is relatively very difficult to etch and therefore copper metallization schemes cannot be realized using the traditional subtractive etching approach used to form aluminum metal lines. The above-mentioned Dual Damascene technique overcomes this problem by etching a columnar hole (or via) and a trench into an inter-layer dielectric (ILD), and then filling both structures with copper, which is subsequently polished back (using CMP) to the surface of the ILD. The result is a vertical copper via connection and an inlaid copper metal line. The trench or the via can be etched first in a Dual Damascene process.

Figure 1G:
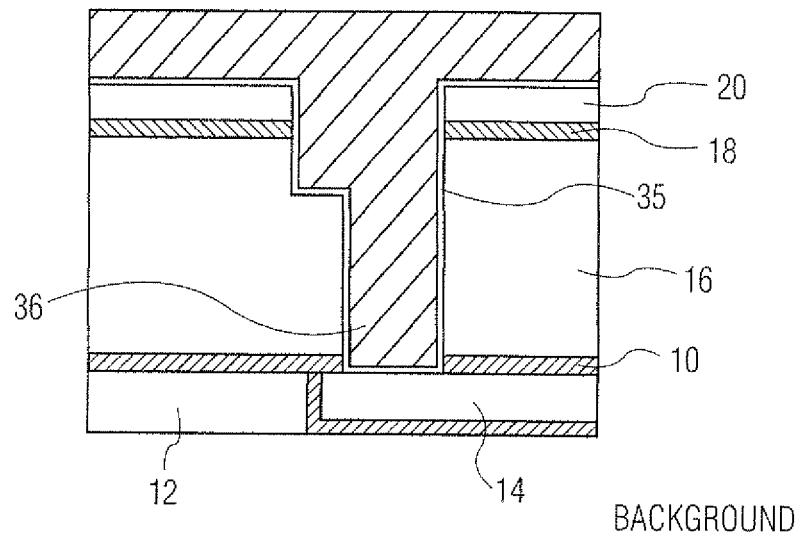
Figure 1H:
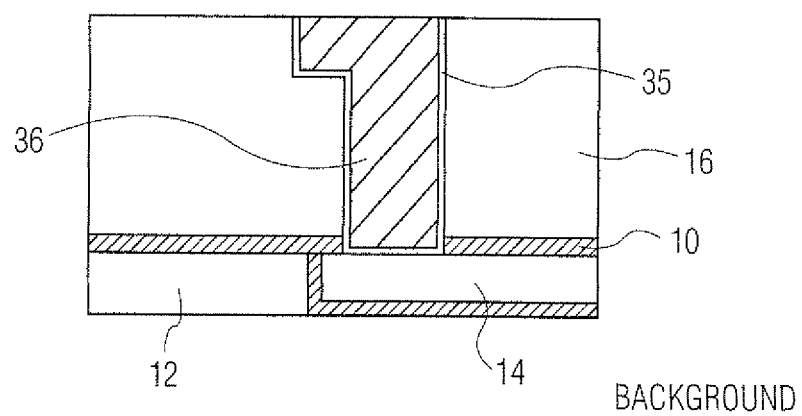

Referring to FIGS. 1a to 1h, in the case of a known partial trench-first integration approach, an etch stop layer 10, typically of Silicon Nitride (SiN) or Silicon Carbide (SiC), is provided over a first ILD 12 and metal interconnect 14 of a first interconnect layer, on which a second ILD 16 is provided which comprises a porous ultra low-k dielectric. An insulating layer 18 (typically $SiO_2$) and a hard mask layer 20 (typically TiN) are provided over the second ILD 16. The hard mask layer 20 on top of the ILD 16 is primarily provided for patterning reasons: with the TiN hard mask, the line width is defined and straight etch profiles can be obtained due to the good selectivity of the TiN hard mask against ULK. In addition, the surface hard mask 20 acts as a CMP stop during subsequent copper polishing.

Next, a photo-resist layer 22 is deposited on the hard mask layer 20 and lithographically patterned, before being stripped to form an opening 24 in the hard mask layer 20. An organic bottom antireflective coating (BARC) 26 is provided over the remaining hard mask 20 and in the opening 24, and a second photo-resist layer 28 is deposited and lithographically patterned, as shown, before being stripped. An etching process is then performed to create a via 30 which extends through the etch stop layer 10 to the metal interconnect 14. The via 30 is filled with a resin material 32 and an etching process is performed to create the trench 34. Next, a barrier layer 35 is deposited on the side-walls sidewalls and bottom of the trench and via opening, and over the remaining mask layer 20, and a layer 36 of copper material is provided over the entire structure and then subjected to CMP to create the interconnect structure illustrated in FIG. 1h.

Thus, as explained above, a resin material is provided in the via to act as an etch stop for the subsequent trench etch. The resin is consumed during the trench etch and protects the via bottom. The problem with this is that the resin partially penetrates into the pores of the ultra low-k dielectric layer 16, and leaves behind a polymeric substance that cannot then be removed.

Thus, in accordance with this exemplary embodiment of the present invention, the thermally degradable "porogen" material is preferably applied before the resin is deposited or, in an alternative exemplary embodiment, the thermally degradable polymer may actually replace the resin in the above-described process.

Figure 2D:
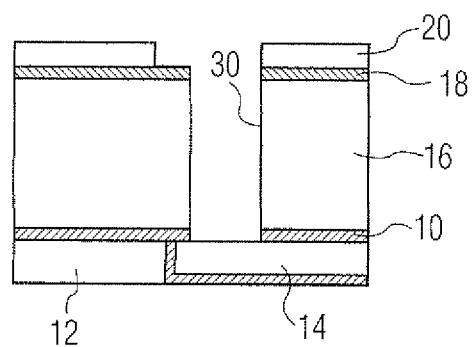
Figure 2E:
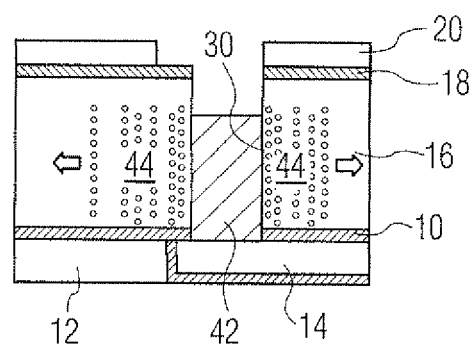
Figure 2F:
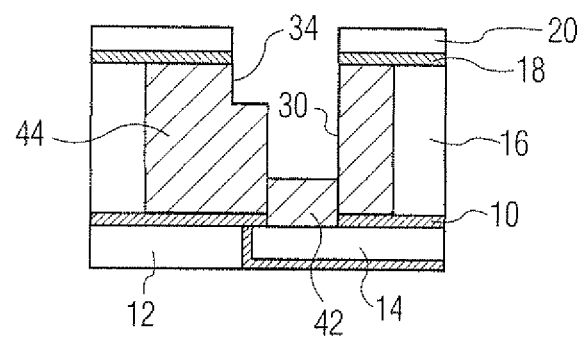

Thus, referring to FIGS. 2a to 2i of the drawings, in a process according to an exemplary embodiment of the present invention, an etch stop layer 10, typically of Silicon Nitride (SiN) or Silicon Carbide (SiC), is provided over a first ILD 12 and metal interconnect 14 of a first interconnect layer, on which a second ILD 16 is provided which comprises a porous ultra low-k dielectric. An insulating layer 18 (typically $SiO_2$) and a hard mask layer 20 (typically TiN) are provided over the second ILD 16. The hard mask layer 20 on top of the ILD 16 is required to protect the ILD from the photo-resist stripping process. This is because the low-k materials that form the ILD 16 are susceptible to the same chemistries that strip photo-resist. In addition, the surface hard mask 20 acts as a CMP stop during subsequent copper polishing.

Next, a photo-resist layer 22 is deposited on the hard mask layer 20 and lithographically patterned, before being stripped to form an opening 24 in the hard mask layer 20. An organic bottom antireflective coating (BARC) 26 is provided over the remaining hard mask 20 and in the opening 24, and a second photo-resist layer 28 is deposited and lithographically patterned, as shown, before being stripped. An etching process is then performed to create a via 30 which extends through the etch stop layer 10 to the metal interconnect 14. The via 30 is filled with a thermally degradable polymeric "porogen" material (i.e. a labile pore generating material) 42, such as, for example, a PMAA (Polymethyl-methacrylate)-or DMAEMA (dimethyl-aminoethyl-methacrylate)-based copolymer material. This porogen material 42 penetrates through the via sidewall deeply into the ULK ILD bulk. This has the effect of filling or "sealing" the pores of the ULK ILD bulk and significantly increasing the density of the ULK ILD material adjacent the via sidewalls, as denoted by reference numeral 44. In an alternative embodiment, the porogen material may be applied to the sidewalls of the via 30 first, so as to enable it to penetrate through the via sidewall deeply into the ULK ILD bulk, following which a resin resist is provided within the via 30. It is an advantage that the porogen is applied after the via etch process, so as to ensure that exposure time to air of the ULK ILD and the moisture uptake are minimized. However, the thermally degradable porogen can be applied just after the blanket porous ULK deposition. If the pore size is sufficiently large and the penetration depth is equal to the stack height, this is a relatively straightforward way to apply the porogen. A potential drawback in this case is that for certain ULK materials, a porosity gradient exists: the films are relatively dense on the top and become more porous with increasing depth. In this case, it is better to apply the porogen after via or line etch.

In either case, an etching process is then performed to create the trench 34 and a barrier layer 35 is deposited on the sidewalls and bottom of the trench and via opening, and on the remaining hard mask layer 20. For the 100 nm process generation uniform barrier deposition becomes problematic in 0.10 μm wide vias with conventional Physical Vapor Deposition techniques. The aim is to avoid the characteristic overhang at the top of a via that arises due to the non-conformal PVD barrier deposition. The problems that could arise due to non-conformal coverage of the barrier are the generation of voids during Cu electroplating, and the limited thickness of the barrier on the sidewall enabling rapid diffusion of Cu into the dielectric. Further scaling could eventually result in a discontinuous film on the sidewall creating easy copper penetration pathways inside the dielectric and Cu diffusion into the active areas. Therefore, conformal, continuous, and thin barrier films are needed for complete Cu filling of vias. ALD can be used for deposition of very conformal barriers. The ALD technique shows excellent step coverage in very high aspect ratio trenches and vias. Therefore, ALD is a method to prepare thin and conformal diffusion barriers or nucleation layers. However, an additional problem arises when the ALD technique is integrated with porous low-k materials. Diffusion of reactants into the low-k dielectric during ALD deposition is a major concern. Nevertheless, the ALD process is able to cover the whole inner surface if diffusion could take place. Thus, by using a denser material (as provided after penetration of the porogen into the ULK ILD bulk) to deposit on instead of a porous dielectric, the ALD reactant diffusion into the dielectric can be prevented. Hence, deposition only takes place on the etched sidewalls without any penetration inside the dielectric. The only constraint is that the barrier deposition temperature should be lower than the decomposition temperature of the thermal degradable polymer. The advantage of using the ALD technique is that highly reactive chemicals can be used (in contrary to CVD), enabling low deposition temperatures. A deposition temperature of 300° C. is easily feasible which is lower than the decomposition temperature of the most commonly used porogens.

Next, a layer 36 of copper material is provided over the entire structure and then subjected to CMP. Finally, either after each copper CMP step or after the complete integration process described above, the structure is subjected to a cure step which causes the thermally degradable polymeric porogen material to decompose and evaporate (i.e., causing the porogens to be removed), leaving a porous SiOC matrix (i.e., an effective porous low-k material) behind, and creating the interconnect structure illustrated in FIG. 2i.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method of forming a conductive interconnect structure on an integrated circuit die, the method comprising:
   providing a layer of porous, low-k dielectric material;
   removing a selected portion of said dielectric material to form a respective opening;
   applying a porogen material to said dielectric material, wherein said porogen material penetrates horizontally from the formed opening into said dielectric material;
   providing a conductive material in said opening to form said conductive interconnect structure; and
   subsequently curing and removing said porogen material from said dielectric material.

2. The method according to claim 1, further comprising:
   applying said porogen material to said dielectric material after formation of said opening.

3. The method according to claim 2, further comprising:
applying said porogen material to a sidewall of said opening.

4. The method according to claim 1, wherein said porogen material comprises a thermally degradable polymer material.

5. The method according to claim 1, further comprising:
subsequent to the application of the porogen material to the sidewalls of the via opening, applying a layer of barrier material to said sidewalls prior to the provision of the conductive material in said via opening.

6. The method according to claim 5, further comprising:
using an atomic layer deposition process to provide said layer of barrier material.

7. The method according to claim 1, wherein said conductive material is copper.

8. A conductive interconnect formed by means of the method of claim 1.

9. An integrated circuit die comprising therein a plurality of conductive interconnects according to claim 8.

\* \* \* \* \*